(12) United States Patent
Daughton et al.

(10) Patent No.: US 6,535,416 B1
(45) Date of Patent: Mar. 18, 2003

(54) MAGNETIC MEMORY COINCIDENT THERMAL PULSE DATA STORAGE

(75) Inventors: James M. Daughton, Eden Prairie, MN (US); Arthur V. Pohm, Ames, IA (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 09/673,827

(22) PCT Filed: Jun. 16, 2000

(86) PCT No.: PCT/US00/40235

§ 371 (c)(1), (2), (4) Date: Apr. 23, 2001

(87) PCT Pub. No.: WO00/79540

PCT Pub. Date: Dec. 28, 2000

Related U.S. Application Data

(60) Provisional application No. 60/139,972, filed on Jun. 18, 1999.

(51) Int. Cl.[7] ............................................... G11C 11/22
(52) U.S. Cl. ........................ 365/145; 365/148; 365/173
(58) Field of Search ................................. 365/145, 173, 365/148

(56) References Cited

U.S. PATENT DOCUMENTS

| 4,771,347 A | | 9/1988 | Horimai et al. ................ 360/59 |
| 4,780,848 A | * | 10/1988 | Daughton et al. ........... 365/173 |
| 5,636,159 A | | 6/1997 | Pohm .......................... 365/158 |
| 5,841,692 A | | 11/1998 | Gallagher .................... 365/173 |
| 2001/0019461 A1 | | 9/2001 | Allenspach et al. ........... 360/59 |

* cited by examiner

*Primary Examiner*—Vu A. Le
(74) *Attorney, Agent, or Firm*—Kinney & Lange, P.A.

(57) ABSTRACT

A ferromagnetic thin-film based digital memory (FIG. 1) having in a bit structure (17,17') a coupled moment material film (13,14,14',14") in which magnetic moments of adjacent atoms, ions or molecules are coupled to one another to maintain some alignment thereof below a critical temperature above which such alignment is not maintained, and also having a plurality of word line structures (20) each located across from the coupled moment material film (13,14,14', 14") in a corresponding one of the bit structures (17,17'). The bit structures (17,17') are sufficiently thermally isolated to allow currents in the adjacent word lines (20) and/or the bit structure (17,17') to heat the bit structure (17,17') to approach the critical temperature which may be supplied coincidently and then reduced to cool the bit structure (17,17') while supplying a magnetic field during the cooling.

79 Claims, 8 Drawing Sheets

MAGNETIC MEMORY COINCIDENT THERMAL PULSE DATA STORAGE

CROSS-REFERENCE TO RELATED APPLICATION

This application claims priority from Provisional Application No. 60/139,972, filed Jun. 18, 1999 for "Coincident Thermal Writing of Spin Valve and Spin Dependent Tunneling Memory Cells", by James M. Daughton and Arthur V. Pohm.

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependent component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

As indicated above, the giant magnetoresistive effect can be increased by adding further alternate intermediate nonmagnetic and ferromagnetic thin-film layers to extend a "sandwich" structure into a stacked structure, i.e. a superlattice structure. The giant magnetoresistive effect is sometimes called the "spin valve effect" in view of the explanation that a larger fraction of conduction electrons are allowed to move more freely from one ferromagnetic thin-film layer to another if the magnetizations in those layers are parallel than if they are antiparallel or partially antiparallel to thereby result in the magnetization states of the layers acting as sort of a "valve."

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

Memory cell structures suitable for permitting the storing and retaining of a digital bit of information, and for permitting retrieving same therefrom has been demonstrated based on a multiple layer "sandwich" construction in a rectangular solid. This cell has a pair of ferromagnetic layers of equal thickness and area separated by a conductive nonmagnetic layer of the same shape and area parallel to the ferromagnetic layers but of smaller thickness. These ferromagnetic layers are each a composite layer formed of two strata each of a different magnetic material, there being a relatively thin ferromagnetic stratum in each of the composite layers adjacent the nonmagnetic layer and a thicker ferromagnetic stratum in each of the composite layers adjacent the thin ferromagnetic stratum therein. The ferromagnetic material of the thick stratum in one of the composite layers is the same as that in the thin stratum in the other composite layer, and the ferromagnetic material of the thin stratum in the first composite layer is the same as the ferromagnetic material in the thick stratum of the second composite layer. Each of the composite layers is fabricated in the presence of a magnetic field so as to result in having an easy axis parallel to the long sides of the rectangular solid. The dimensions of cell structures as part of development efforts are in many instances relatively large for development purposes.

One such memory cell structure has a pair of ferromagnetic layers of matching geometries but different magnetic materials in the strata therein to result in one such layer having effectively a greater saturation magnetization and a greater anisotropy field than the other to result in different coercivities in each. In addition, the structure results in a coupling of the magnetization between the two ferromagnetic layers therein due to exchange coupling between them leading to the magnetizations in each paralleling one another in the absence of any applied magnetic fields. As a result, the electrical resistance of the cell along its length versus applied magnetic fields in either direction parallel thereto is represented by two characteristics depending on the magnetization history of the cell. Each of these characteristics exhibits a peak in this resistance for applied longitudinal fields having absolute values that are somewhat greater than zero, one of these characteristics exhibiting its peak for positive applied longitudinal fields and the other characteristic exhibiting its peak for negative applied longitudinal fields. The characteristic followed by the resistance of the cell for relatively small applied longitudinal fields depends on which direction the magnetization is oriented along the easy axis for the one of the two ferromagnetic layers having the larger coercivity. Thus, by setting the magnetization of the layer with the higher coercivity, a bit of digital information can be stored and retained, and the value of that bit can be retrieved without affecting this retention through a determination of which characteristic the resistance follows for a relatively small applied longitudinal field.

Such memory cell behavior for this structure can be modeled by assuming that the ferromagnetic layers therein are each a single magnetic domain so that positioning of the magnetization vectors in the ferromagnetic layers is based on coherent rotation, and that uniaxial anisotropies characterize those layers. The angles of the magnetization vectors in the two ferromagnetic layers with respect to the easy axis in those layers are then found by minimizing the magnetic energy of these anisotropies summed with that due to the applied fields and to exchange coupling. That total energy per unit volume is then $$E_{Tot} = E_1 + E_2 + E_{12}$$
$$= K_{u1}\sin^2\theta_1 - M_{s1}H\cos(\Psi - \theta_1) +$$
$$K_{u2}\sin^2\theta_2 - M_{s2}H\cos(\Psi - \theta_2) +$$
$$A_{12}\cos(\theta_1 - \theta_2).$$

Here, $K_{u1}$, and $K_{u2}$ are anisotropy constants, $A_{12}$ is the exchange constant, $M_{s1}$ and $M_{s2}$ are the magnetization saturation values, and H is the externally applied field. As indicated above, once the magnetization vectors have taken an angular position with respect to the easy axis of the corresponding layer at a minimum in the above indicated energy, the effective resistance between the ends of the memory cell structure is determined by the net angle between the magnetization vectors in each of these layers.

Because of the assumption of single domain behavior in the ferromagnetic layers, the above equation would seemingly be expected to improve its approximation of the assistant total magnetic energy as the length and width of that memory cell structure decreased toward having submicron dimensions. However, this mode of operation described for providing the two magnetoresistive characteristics based on the history of the layer magnetizations, in depending on the differing anisotropy fields in the two ferromagnetic layers because of the differing materials used therein, becomes less and less reliable as these dimensions decrease. This appears to occur because decreasing the cell dimensions gives rise to larger and larger demagnetizing fields in the two ferromagnetic layers which, at some point, overwhelm the effects of the anisotropy fields so that the above described behavior no longer occurs as described. In addition, the magnetizations of the two ferromagnetic layers rotate together under the influences of externally applied fields at angles with respect to the corresponding easy axis at angular magnitudes much more nearly equal to one another because of the increasing demagnetization fields in these layers as the dimensions thereof decrease. As a result, these ferromagnetic layers are less and less able to have the magnetizations thereof switch directions of orientation independently of one another as the dimensions thereof decrease so that the structure they are in becomes less able to provide the above described memory function in relying on only these ferromagnetic layer anisotropy differences.

An alternative memory cell structure which is more suited to submicron dimensions is a cell of the kind described above exhibiting "giant magnetoresistive effect" but which has the two composite ferromagnetic layers formed of different thicknesses in the thick strata therein. Thus, the thick strata in one might be on the order of 40 Å while that of the other might be on the order of 55 Å as an example. In this structure, reducing the size to submicron dimensions uses the shape anisotropy introduced by this thickness difference to provide different switching thresholds for each of the ferromagnetic composite layers in response to externally applied operating magnetic fields. The shape anisotropy leads to the effect of the demagnetizing field of one layer affecting the switching threshold of the other after the former layer has switched its magnetization direction. As a result, the thicker ferromagnetic layer has a magnetization which is fixed in orientation for externally applied operating magnetic fields that are just sufficient to switch the thinner ferromagnetic composite layer but not great enough to switch the magnetization of the thicker ferromagnetic composite layer. In effect, the demagnetizing fields as the device becomes sufficiently small dominate the anisotropy fields that result from the deposition of the ferromagnetic layers in the presence of a magnetic field.

In the absence of externally applied operating magnetic field, the two composite ferromagnetic layers have the magnetizations therein pointing in opposite directions, i.e. they are antiparallel to one another, to result in the structure as a whole having relatively small cell demagnetizing fields and small external stray fields to affect the nearby memory cells. The direction of magnetization in the thicker ferromagnetic composite layer is used to store the digital information which can only be changed in direction by externally applied fields great enough to switch magnetization directions in both composite ferromagnetic layers. That is, storing new information in the cell requires that the thicker ferromagnetic layer be capable of having the magnetization direction therein switched to be in accord with the incoming digital data.

Retrieving information from such a memory cell is accomplished by switching the magnetization direction of the thinner ferromagnetic composite layer only as a basis for determining in which direction relative to the thinner layer is the magnetization oriented in the thicker layer. Typically, both such storing and retrieving has meant that there needs to be a pair of external conductors which can coincidentally supply current to result in a field large enough to switch the magnetization of the thicker ferromagnetic composite layer, but with that current in either conductor alone being able to generate fields only sufficient to switch the threshold of the thinner ferromagnetic layer. In some situations, only a single external conductor need be provided for this purpose because the sense current used in retrieving information from the memory cell can provide the coincident current needed with the current in the external conductor to switch the magnetization direction of the thicker ferromagnetic layer. Such a memory cell is described in U.S. Pat. 5,996,322 to A. Pohm and B. Everitt entitled "Giant Magnetoresistive Effect Memory Cell" assigned to the same assignee as the present application and which is hereby incorporated herein.

Alternatively, a digital data bit storage and retrieval memory cell suited for fabrication with submicron dimensions can be fabricated that provides rapid retrievals of bit data stored therein and low power dissipation by substituting an electrical insulator for the conductor in the nonmagnetic layer. This memory cell can be fabricated using ferromagnetic thin-film materials of similar or different kinds in each of the magnetic memory films used in a "sandwich" structure on eitherside of an intermediate nonmagnetic layer which ferromagnetic films may be composite films, but this intermediate nonmagnetic layer conducts electrical current therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance or conductance characterizing this intermediate layer with respect to the "tunneling" current therethrough. In addition, shape anisotropy can be used in such a cell to provide different magnetization switching thresholds in the two ferromagnetic layers by forming one of the ferromagnetic layers to be thicker than the other, especially in those situations in which the same material is used for each of the ferromagnetic layers on either side of the intermediate layer. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similarsized cell structure. Such a memory cell is described in U.S. Pat. No. 5,996,322 indicated above, and in an earlier filed co-pending application by J. Daughton, B. Everitt and A. Pohm entitled "Spin Dependent Tunneling memory" having Ser. No. 09/435,598 assigned to the same assignee as the present application and which is hereby incorporated herein.

Further alternatives to each of the foregoing kinds of memory cell structures are made available by the use therein of additional structure to provide different switching thresholds for each of he ferromagnetic composite layers in response to externally applied operating magnetic fields rather than (or in addition to) ferromagnetic layer thickness differences or material differences. The greater stability of one ferromagnetic layer to externally applied operating magnetic fields than the other as a basis for storing information can be provided by using an added antiferromagnetic layer, or composite layer including an antiferromagnetic layer, to "pin" the magnetization direction of one of the ferromagnetic layers in a selected direction while leaving the remaining ferromagnetic layer or layer relatively unaffected with respect to such stability against externally applied operating magnetic fields. Such ferromagnetic layers and antiferromagnetic layers each are coupled moment material films in which magnetic moments of adjacent atoms, ions or molecules are coupled to one another to maintain some alignment thereof below a critical temperature, but antiferromagnetic films have such coupled moments balanced in opposite directions to have no net magnetic moment.

Thus, a further antiferromagnetic material "pinning" layer is deposited immediately adjacent the ferromagnetic layer selected for "pinning" to strongly set the magnetization direction of that layer. Such an antiferromagnetic layer through exchange coupling to the adjacent ferromagnetic layer strongly fixes the selected direction of magnetization of that ferromagnetic layer. An IrMn antiferromagnetic pinning layer of 20% iridium and 80% manganese can be sputterdeposited adjacent the selected ferromagnetic layer to a thickness of 100 Å in the presence of a magnetization axis determination magnetic field aligned with the fields used in selecting the direction of magnetization of the ferromagnetic layer to accomplish the pinning thereof. Alternatively, the antiferromagnetic pinning layer can be formed using FeMn, NiMn, PtMn, PtRhMn or PtRuMn or some other antiferromagnetic materials.

All of these foregoing kinds of memory cells are desired to be shrunk in size to the extent possible to increase the cell density across the area of the substrate supporting them, such as an electrically insulative layer substrate formed in a monolithic integrated circuit containing the operating circuitry for operating such a memory. However, as the design widths of these cells are shrunk to small fractions of a micron, the subsequently fabricated cells have a correspondingly greater reduction in relative total cell volume.

Memory cells without "pinning" layers therein have differences in switching thresholds for each of the included ferromagnetic composite layers in response to externally applied operating magnetic fields determined primarily by the difference in the transverse demagnetizing fields of these two ferromagnetic layers and the volumes thereof so that this threshold difference decreases with decreasing volume. This threshold difference is, of course, effectively reduced during storage and retrieval operations of a memory array if a current is introduced either as a word line current through the word line adjacent a memory cell or a sense current through the memory cell as either provides magnetic fields directed to cause ferromagnetic layer magnetization direction switching. Even though both such currents are intended to be required to occur with respect to a cell for the magnetization direction of the more stable ferromagnetic layer therein to switch direction, the provision of one such current in a cell with relatively small switching threshold due to small cell volume may allow thermal fluctuations in the cell to provide enough cell energy to affect the threshold so as to allow its being exceeded in these circumstances. Cells with a "pinned" layer have improved thermal stability allowing further scaling to even smaller sizes but will at some point also become susceptible to thermal fluctuations.

Thus, a typical memory cell without a "pinned" layer, having a word line current applied in the word line adjacent thereto that provides a corresponding magnetic field equal to one half of the cell thicker layer anisotropy field, has the added energy required to result in switching reduced to a quarter of the value needed in the absence of such word line current, i.e. to a quarter of $\frac{1}{2}*H_k*M_s*V$. Here, $H_k$ is the anisotropy field, $M_s$ is the magnetic saturation and $V$ is the volume. Of course, if such cells with a word line current provided are stable against thermal fluctuations, those cells in the array without such currents present should also be stable.

In operating commercial semiconductor devices, junction temperatures are usually limited to 125° C. or less because of increased structural failures in such devices and in the interconnections therebetween at elevated temperatures. Thus, such a temperature is a reasonable upper operating temperature limit for such cells. This allows a maximum operating temperature rise of 100° C. from an assumed ambient temperature of 25° C.

The failure rate for semiconductor devices due to structural failures therein has been observed to be on the order of $10^{-4}$ events per year. Thus, a conservative requirement for thermally induced errors is to have them be relatively insignificant by requiring them to be an order of magnitude less frequent, or $10^{-5}$ events per year. Although such thermally induced errors can be corrected with error correction circuitry, the error rate increases very rapidly as the average energy of thermal fluctuations approaches the energy required to switch the magnetization states of memory cell devices.

Memory cells considered as single magnetic domains (a reasonable assumption for the very small cells involved) have been determined to exhibit spatial oscillations in their shapes as a result of external stimuli such as thermal fluctuations in two normal modes, which oscillations can lead to corresponding oscillatory changes in the switching threshold values thereof. The associated decay times for such oscillatory behaviors have been observed to typically be around 0.5 and 1.0 ns for the two modes. Choosing the mode with the shorter decay time to provide the greater number of oscillations, the inverse of the associated decay time provides a measure of the number of oscillatory threshold minimums (and maximums) occurring in that mode per second. Multiplying this number of minimums per second by the number of memory cells under the influence of magnetic fields established by currents through a word line, the fraction of time that a word line has currents flowing therein during memory operation, and the number of seconds in a year provides an approximation of the number of oscillatory threshold minimums occurring in a year.

The energy of thermal fluctuations stimulating memory cells in a memory device is randomly distributed over an energy range which, from thermodynamics, can in many circumstances be represented by the well known Boltzmann probability distribution involving the average energy of the fluctuations. The difference between this average energy and the cell switching energy required after a word current is initiated in the word line adjacent to the cell forms an energy well, $E_w$, which must be maintained to meet the desired thermally induced error rate, or $$10^{-5}=(1/0.5*10^{-9})*(500)*(1/3)*(3600*24*365)*e^{-E_w/kT}.$$

Here, $1/0.5*10^{-9}$ is the inverse of the relaxation time, 500 is a typical number of memory cells affected by the magnetic fields arising from a word line, $1/3$ is the fraction of operating time current is introduced in a word line, $3600*24*365$ is the number of seconds in a year, and $e^{-E_w/kT}$ is the Boltzmann distribution factor with T being the absolute temperature and k being Boltzmann's constant.

From the foregoing equation, an energy well of 55 kT is needed for thermal stability after current is introduced in a word without sense currents being initiated in the cells under the influence of that word line, or just less than 2 electron volts. To meet this requirement for a memory cell on the order of 0.1 μm wide by 0.4 μm long, the shape anisotropy of the thicker and thinner ferromagnetic layers must be at least 500 Oe and 300 Oe respectively. Since the width and length for this cell are already determined, these anisotropy fields must be provided by properly choosing the thicknesses of these layers requiring 40 to 50 Å of thickness for the thicker layer and 20 to 25 Å of thickness for the thinner layer. The magnetic fields necessary to reach the layer thresholds to cause switching of the thicker layer magnetization direction for memory cells of smaller and smaller lengths and widths begins to require currents through such cells and associated word lines of magnitudes that result in current densities sufficient to cause significant electromigration of the conductive materials and operating temperature rises which will alter device behavior and structure thereby leading to a limit of some minimum size for these cells. Thus, there is a desire to find another method of operating such cells to store information therein.

BRIEF SUMMARY OF THE INVENTION

The present invention provides a ferromagnetic thin-film based digital memory having in a bit structure a coupled moment material film in which magnetic moments of adjacent atoms, ions or molecules are coupled to one another to maintain some alignment thereof below a critical temperature above which such alignment is not maintained, and also having a plurality of word line structures each located across from the coupled moment material film in a corresponding one of the bit structures, these bit structures being sufficiently thermally isolated to allow currents in the adjacent word lines and/or the bit structure to heat the bit structure to approach the critical temperature. Currents can be supplied coincidently in the adjacent word line and the bit structure, or instead in a further conductor also adjacent the bit structure rather than in that structure, to cause such a temperature rise, and then reduced to cool the bit structure while supplying a magnetic field during the cooling to select the direction of magnetization to be maintained thereafter until new data is next stored therein.

DETAILED DESCRIPTION

Figure 1A:
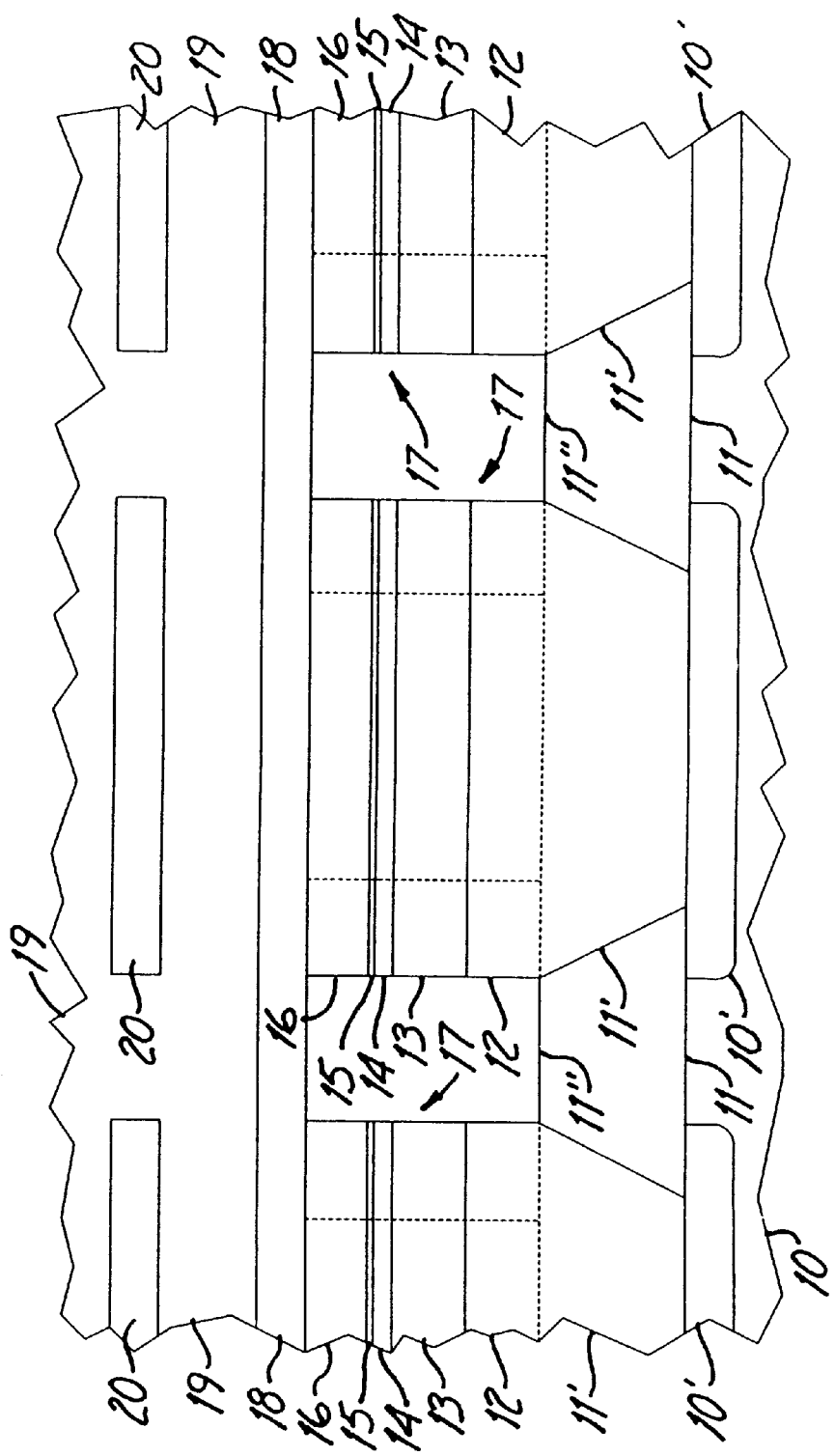
FIGS. 1A, 1B and 1C represent layer diagrams of portions of monolithic integrated circuit structures embodying the present invention.

As indicated above, thermal stability of the kinds of memory cells described above which do not use a "pinning" layer requires a differential between the energy needed to switch the harder ferromagnetic layer and the average thermal fluctuation energy during times that currents are in word lines, i.e. an energy well, of at least 55 kT. Somewhat less of an energy well is needed for memory cells having a "pinning" layer therein because of the greater stability such a layer provides, but there are nonetheless some minimum wells required in these instances also. As the lengths and widths of these cells are shrunk, the anisotropies of the ferromagnetic layers, and so the externally applied magnetic fields used to the switch the orientations of their magnetizations, must correspondingly get larger to meet this requirement. These changes lead to larger current densities which in turn lead to larger temperature rises during operation and electromigration of the current conductors which become unacceptably large at some point insofar as maintaining device behavioral characteristics while also providing magnetic fields great enough to cause magnetization direction switching in the ferromagnetic layers.

However, allowing memory cell device operating temperature increases due to heating because of supplying word line currents adjacent to, and sense currents in, memory cells sufficient to approach or exceed the Curie temperature of the ferromagnetic layers in memory cells without a "pinning" layer or layers therein, or to approach or exceed the blocking temperature of the antiferromagnetic "pinning" layer in cells having such a layer, permits storage of information therein to be achieved without reaching current magnitudes otherwise necessary to switch the magnetization direction of the harder ferromagnetic layer. The direction of magnetization of the thicker ferromagnetic layer can be selected by having a moderate magnetic field present oriented in the selected direction when the layer cools sufficiently below its Curie temperature for calls without a "pinning" layer present, or by a field sufficient to set the direction of the ferromagnetic layer adjacent an antiferromagnetic "pinning" layer when that "pinning"layer cools sufficiently below its blocking temperature for cells using such a "pinning" layer or, alternatively, a "pinning" layer composite. The blocking temperature of an antiferromagnetic layer is the temperature at or above which that layer loses its ability to "pin" the magnetization direction of an adjacent ferromagnetic layer below its Curie temperature which blocking temperature is usually less than the Neel temperature of that layer. Similarly, the Curie temperature may not need to be fully reached to allow relatively easy reorienting of the magnetization direction therein.

Reducing the magnitudes of currents necessary for causing the harder ferromagnetic layer in memory cells without a "pinning" layer to approach or reach its Curie temperature, or the antiferromagnetic layer in memory cells with a "pinning" layer arrangement to approach or reach its blocking temperature, and insulating such memory cells from their neighboring cells to provide good cell selectivity in storing information requires providing some thermal isolation of each cell from its neighbors and the integrated circuit substrate or any other kind of substrate otherwise serving as a heat sink. Such thermal isolation can be provided by use of electrically conductive interconnections that are of a relatively low thermal conductivity, and by supporting the memory cell on an electrical insulator of relatively low thermal conductivity. Some examples are shown in FIGS. 1A, 1B and 5C.

Figure 1B:
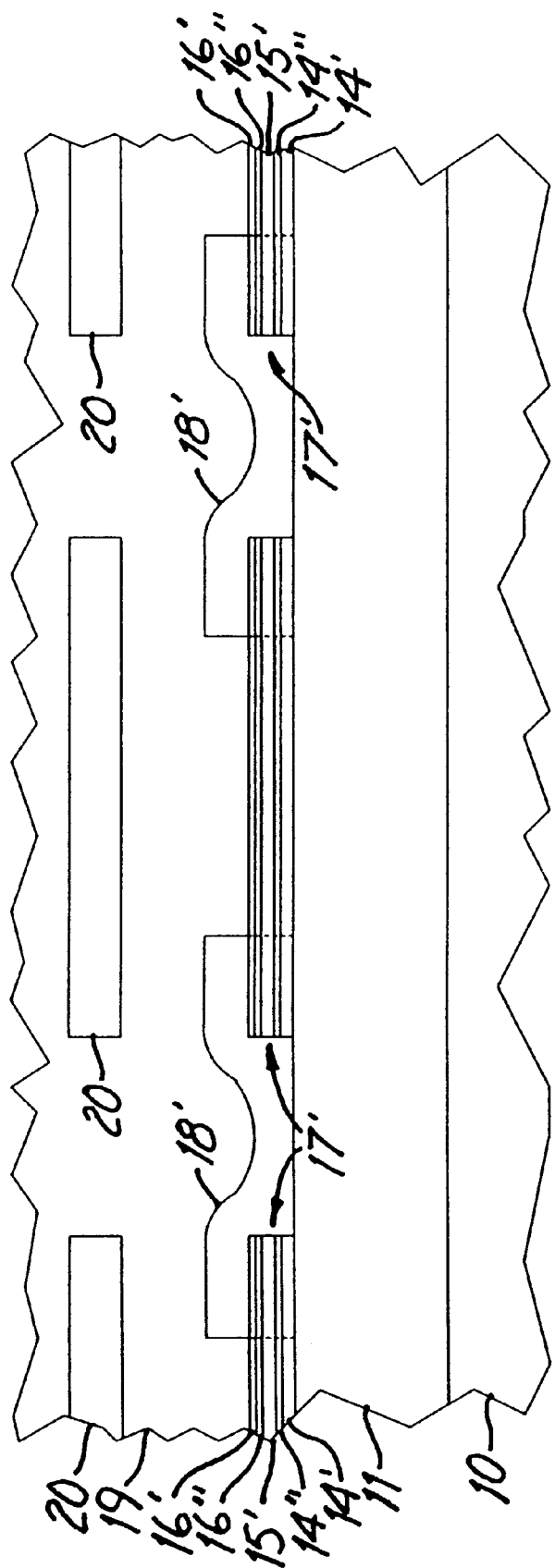

FIG. 1A shows spin dependent tunneling memory cells formed on a silicon based integrated circuit substrate, 10, of one conductivity type, typically p-type, in which pn junction isolated regions, 10', of n-type conductivity are provided. Such regions and junctions can be part of either diodes or transistors electrically connected to the spin dependent tunneling memory cells thereabove to be used to selectively electrically connect those cells into and out of operating circuits provided at least in part in integrated circuit 10. A layer of $SiO_2$ or silicon dioxide, or alternatively, $Si_3N_4$, or silicon nitride, 11, is provided on integrated circuit 10 as part of the substrate which subsequently has via openings provided therein filled with aluminum to provide conductive interconnection plugs, 11', as parts of the interconnection paths between the electrical selection devices in integrated circuit 10 and the spin dependent tunneling memory cells above.

The spin dependent tunneling memory cells structures are each supported on one of interconnection plugs 11' each formed as a rectangular solid between the vertical dashed lines with each narrow end thereof extending into a corresponding triangularshaped solid when viewed from the top to finally end at an apex of the triangle. Each of these memory cells structures has a first layer of TaN, or tantalum nitride, 12, provided to a thickness of 150 Å to serve as a further interconnection conductor but one with much lower thermal conductivity than the aluminum therebelow to thereby provide some thermal isolation of the memory cell structure thereabove from the substrate below. The amount of tantalum therein can be adjusted to select to a degree the desired thermal conductivity.

The next layer therein is of FeMn, or iron manganese, 13, provided on layer 12 as an antiferromagnetic "pinning" layer for the next on the stack ferromagnetic layer. This "pinning" layer is 150 Å thick, and could alternatively have a composite "pinning" layer in place thereof comprising first the antiferromagnetic layer, and then a cobalt layer, a ruthenium layer, and finally another cobalt layer to there by provide greater pinning of the adjacent ferromagnetic layer. This next adjacent ferromagnetic layer, 14, provided on the "pinning" layer, is 40 Å thick and formed of 60% iron and 40% cobalt. A 15 Å thick layer of aluminum oxide, 15, which is electrically insulating is provided on ferromagnetic layer 14 in each structure as the intermediate nonmagnetic tunneling barrier layer Finally, each memory cell structure is completed by a 125 Å thick permalloy ferromagnetic layer, 16, formed of 60% nickel, 25% cobalt and 15% iron provided on the intermediate layer. Each completed memory cell, or bit, structure, 17, shown has its ferromagnetic layer 16 interconnected with the ferromagnetic layers 16 of the others by a 100 Å thick W, or tungsten, layer, 18, which though electrically conductive has a relatively small thermal conductivity. Thus, sense current can be provided through each memory cell 17 (by tunneling through barrier layer 15) between interconnection 18 and the remaining circuitry in integrated circuit 10. Silicon dioxide or silicon nitride, 11", separates memory cell structures from one another by a distance around one half the width of the cell to provide electrical and thermal isolation therebetween.

An insulating layer, 19, on interconnection 18 separates each memory cell structure 17 from a corresponding adjacent word line, 20, provided thereover by 200 Å. Each word line 20 is 100 Å thick and formed of tungsten so as to have a higher electrical resistivity to enhance the generation of heat therein for purposes of selectively raising the temperature of "pinning" layer 13 past its blocking temperature. A particular one of memory cell structures 17 can be selected for heating past this temperature for purposes of storing new data therein by coincidently supplying both a word line current pulse in the adjacent word line and a sense current pulse through that cell of sufficient magnitudes for a sufficient time to provide coincident thermal pulses at that cell to cause the desired temperature rise therein. The same cell can be selected for retrieving that data by supplying such currents but of smaller magnitudes, perhaps one half the magnitude used for storing data, or alternatively, the same currents or other somewhat smaller currents can be supplied but for much less time during a pulse.

As an alternative for heating the cell, a separate tungsten heating conductor can be provided in addition to, and paralleling, interconnection 18. Such an arrangement can ease the requirements otherwise placed on the structure for interconnection 18.

FIG. 1B shows memory cell devices formed without having a "pinning" layer present but instead providing one of the ferromagnetic layers therein a higher magnetization switching threshold than the other (magnetically "harder" than the other) either making it substantially thicker than the other or by choosing a different ferromagnetic material therefor having a higher coercivity, or both. Furthermore, these cell structures are shown with a conductive intermediate nonmagnetic layer between the two ferromagnetic layers rather than an electrical insulating layer as before so that these devices operate based on the "giant magnetoresistive effect" (GMR effect), but they could alternatively be constructed with the same barrier layer as used above to then be spin dependent tunneling devices though a connection for each to a lower conductor or to integrated circuit 10 would again be used. These memory cell structures are again formed on an integrated circuit substrate 10 with memory operating circuitry contained therein covered by a 300 Å thick insulating layer 11 of silicon dioxide or silicon nitride. No interconnection to the substrate circuitry is needed with each of the cell structures shown as they are interconnected to one another in an electrical series interconnection so that such connections need only be provided at the ends of the series string of cells.

Each memory cell structure in FIG. 1B begins with a composite ferromagnetic layer as the first ferromagnetic layer 14 formed on insulating layer 11. A first permalloy layer with the same composition previously given is provided to a thickness of 30 Å as a first composite layer stratum, 14', with a second layer as the second stratum, 14", being provided to a thickness of 15 Å comprising 95% cobalt and 5% iron. This last strata immediately adjacent the nonmagnetic layer next to be provided provides a greater GMR effect because of having higher spin polarization characteristics but its greater magnetic hardness would make switching its magnetization direction more difficult and so the magnetically softer first strata is used also to ease this problem.

A 30 Å thick copper layer, 15', is then provided as the intermediate nonmagnetic conductive layer, and another composite ferromagnetic layer 16 is provided on intermediate layer 15' inverted in upward order from composite layer 14 so that a second stratum, 16", of 15 Å thickness is against layer 15' and a first stratum, 16', is positioned on stratum 16". The compositions of the strata in composite layer 16 are the same as those in composite layer 14 with the same number of prime marks in the numerical designation thereof, but the thickness of layer 16' is only 15 Å to provide a thinner ferromagnetic composite layer than composite layer 14. The resulting memory cell structures, 17', are interconnected in series with neighboring ones thereof by tungsten interconnections, 18', to allow a sense current to be established through all of the cells in the resulting series string thereof. Insulating layer 19 again separates each of word lines 20 from the corresponding ones of memory cell structures 17' by 200 Å.

Here too, a memory cell structure 17' can be selected for heating for purposes of storing new data therein by coincidently supplying both word line current in the adjacent word line and sense current through that cell of sufficient magnitudes for a sufficient time. The same cell can again be selected for retrieving that data by supplying such currents but of smaller magnitudes, as before perhaps one half the magnitude used for storing data.

Figure 1C:
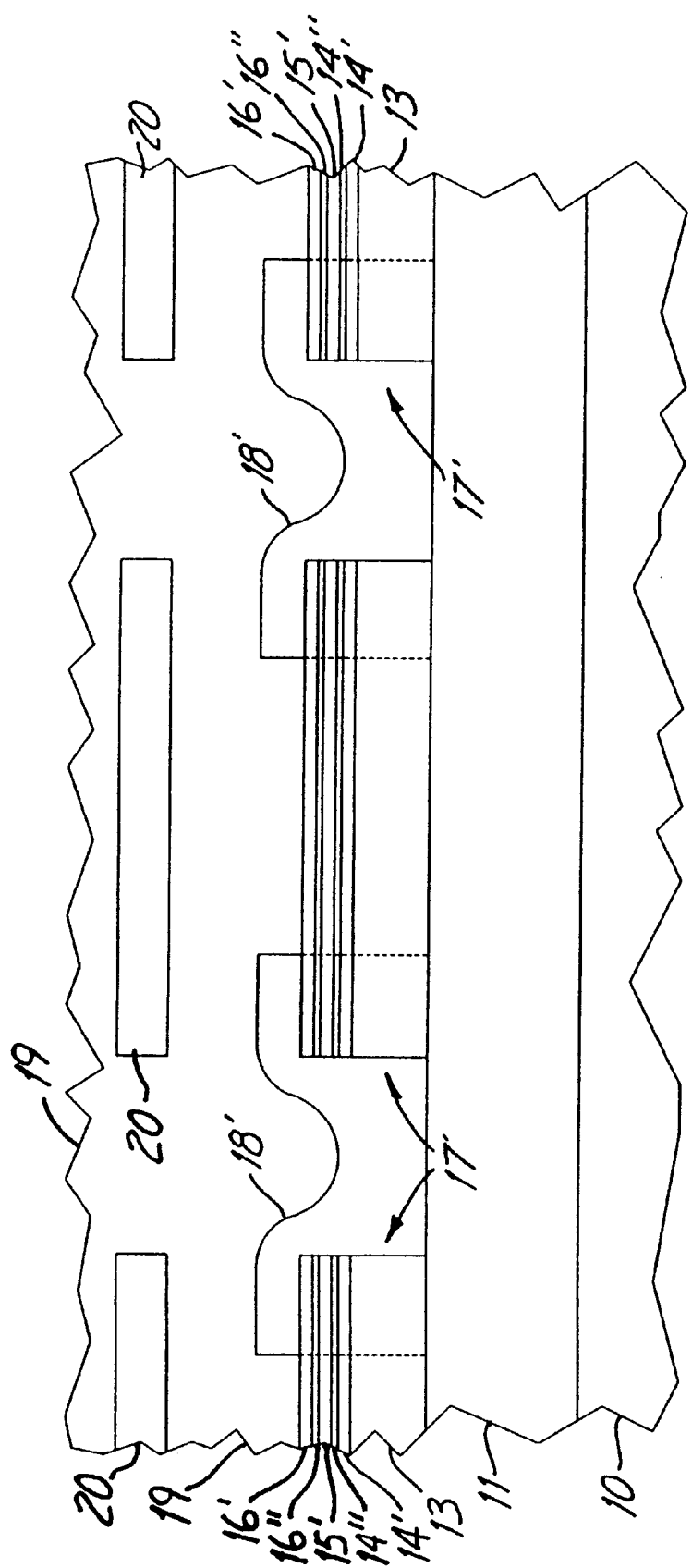

FIG. 1C shows a spin valve memory cell structure which depends on use of antiferromagnetic "pinning" layer 13 as in FIG. 1A but uses nearly the same memory cell structures as those shown in FIG. 1B. The cell structures of FIG. 1C use a conductive intermediate layer 15' as in FIG. 1B but, however, with stratum 14' of composite layer 14 and stratum 16' of composite layer 16 each having a thickness of 30 Å. Thus, "pinning" layer 13 again effectively causes composite layer 14 to be magnetically harder than composite layer 16. Essentially the same steps for storing and retrieving data in a cell 17' of FIG. 1C are used as were used for the cells of FIG. 1B.

In such arrangements where memory cell structures have data stored therein by selectively heating the structures, the desired rapidity of storage is achieved by using thin isolating layers such as the dielectrics. In thin dielectrics, thermal equilibrium is reached in a very short time. This can be directly calculated by use of the Fourier heat conduction equation and the appropriate material parameters. The temperature rise is given in general by that equation as $$\frac{\partial T}{\partial t} = \frac{k_{th}}{CpP}\left[\frac{\partial^2 T}{\partial x^2} + \frac{\partial^2 T}{\partial x^2} + \frac{\partial^2 T}{\partial x^2}\right],$$

where T is the temperature, t is the time, $k_{th}$ is the thermal conductivity, P is the density, Cp is the specific heat at constant pressure, and x-y-z are the geometrical coordinates. The thermal diffusivity constant is given by:

$$k_d = \frac{k_{th}}{CpP}.$$

In one dimension which is a reasonable approximation with a large heat sink directly below the heating sources, the temperature rise is given by $$\frac{\partial T}{\partial t} = kd\frac{\partial^2 T}{\partial x^2}.$$

Consider a one micron wide line made of 100 Å thick tungsten over 500 Å of silicon dioxide in a substrate having a silicon integrated circuit therebelow with one of the memory cells provided in the silicon dioxide 200 Å below the word line. The thermal conductivity of silicon dioxide is 0.014 watts/° C. cm, for tungsten 1.87 watts/° C. cm, and for silicon 1.5 watts/° C. cm. Because the silicon has more than 100 times the thermal conductivity of the silicon dioxide the silicon in the remaining portions of the substrate can be treated as an infinite heat sink. The volume specific heat for silicon dioxide is 2.27 joules/° C. cm$^3$ and for tungsten is 3.66 joules/° C. cm$^3$. The tungsten line has a resistivity of about 8 ohms per square.

Figure 2:
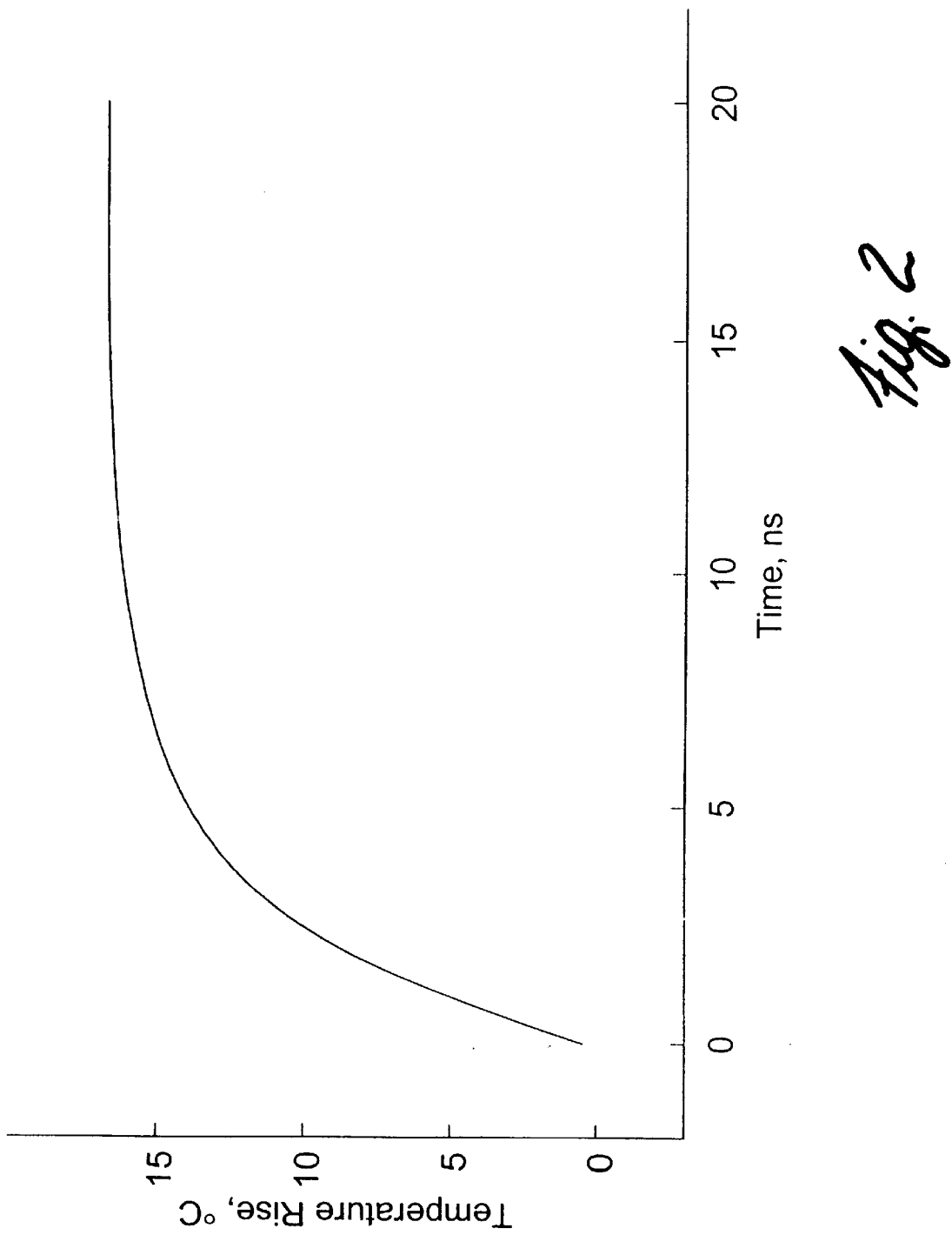
FIG. 2 represents graph of a response for a structure similar to one of those shown in FIGS. 1A, 1B and 1C, FIGS. 3A, 3B and 3C represent timing diagrams for inputs and responses for a structure similar to one of those shown in FIGS. 1A, 1B and 1C, FIGS. 4A, 4B and 4C represent timing diagrams for inputs and responses for a structure similar to one of those shown in FIGS. 1A, 1B and 1C, FIGS. 5A and 5B represent characteristic diagrams for structures similar to the one shown in FIG. 1A.

For this example, a 10 mA current was "stepped", or initiated abruptly, into the word line and the temperature transient was determined using the above parameters in a numerical solution of the above one dimension diffusion equation. FIG. 2 shows the 17° C. rise reaching 90% of its final value in 6.5 nanoseconds. Thus, thermal time constants are not a limiting factor in storage rapidity for sufficiently small versions of the above described memory cells.

Figure 3A:
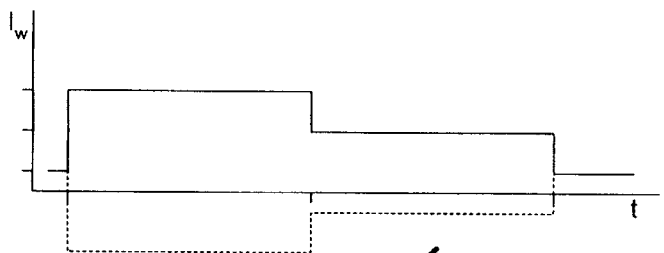

In operation, using coincident pulses in the word current, $I_w$, and in the sense current, $I_s$, to store and retrieve information from these kinds of memory cells, there will be typical waveforms of the kinds illustrated in FIG. 3 corresponding to storage of data based on thermal pulses and FIG. 4 corresponding to data retrieval. In FIG. 3A, a full magnitude current pulse with respect to the initial zero magnitude is applied in the word line adjacent the memory cell in which data is to be stored during the first time period shown. Either a positive current represented by the solid line or, alternatively, a negative current represented by the short dashed line in FIG. 3A can be used depending on the direction of magnetization desired to be stored in the ferromagnetic material associated with the magnetically harder side of the nonmagnetic intermediate layer.

Figure 3B:
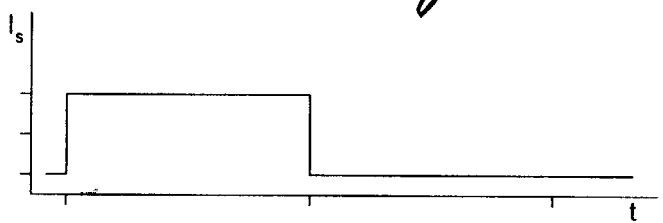

A similar full magnitude current pulse during that first time period is applied through the cell as a sense current as shown in FIG. 3B. Together, the heat generated by these current pulses forces the temperature of the cell up from its ambient value to past either the ferromagnetic material Curie temperature, or the antiferromagnetic material blocking temperature, depending on the kind of cell, as represented by the long dashed line in FIG. 3C. In this situation, the ferromagnetic material associated with the magnetically harder side of the nonmagnetic intermediate layer can relatively easily have the direction of magnetization therein set in the desired direction to hereby store a bit of data therein as described above.

This storage is accomplished by letting the cell cool below the pertinent one of the Curie or blocking temperatures (represented by the long dashed line in FIG. 3C) while maintaining a magnetization direction setting magnetic field. To do so, the word line current in the second time period shown in FIG. 3A is reduced in magnitude by one half with the remaining half magnitude current serving to provide the direction selection magnetic field for the ferromagnetic material associated with the magnetically harder side of the nonmagnetic intermediate layer during this cooling. The magnetization direction selected depends on which direction through the adjacent word line the word line current follows in being either the solid line current or the short dashed line current of FIG. 3A.

Figure 3C:
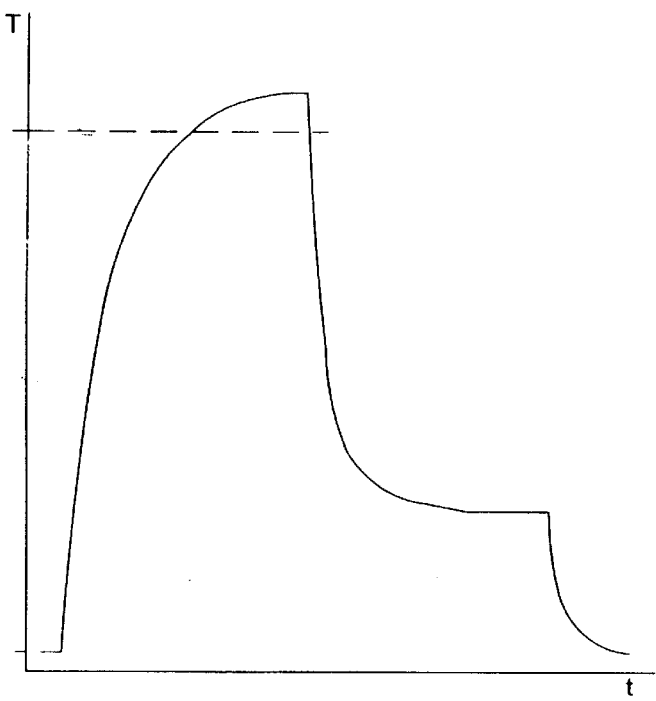

The sense current in the second time period shown in FIG. 3B is reduced to zero to speed cooling. As can be seen in FIG. 3C, the temperature of the cell decreases below the dashed line temperature quickly. Following the second time period shown in FIG. 3A, the word line current is reduced to zero and the cell temperature shown in FIG. 3C falls back to its ambient value thereby completing the storage operation.

Figure 4A:
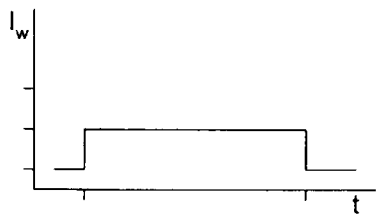
Figure 4B:
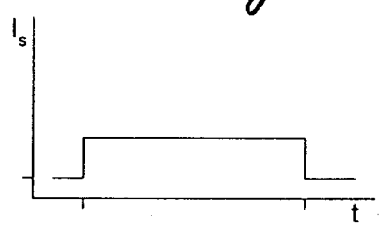
Figure 4C:
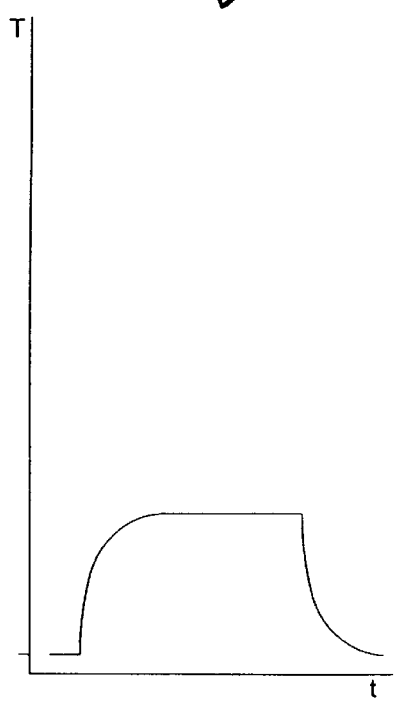

Retrieving information from the same cell as to the direction of magnetization of the ferromagnetic material associated with the magnetically harder side of the nonmagnetic intermediate layer is shown in FIG. 4 to be completed in the one time period shown. A half of the full magnitude current pulse is provided in this time period in both the adjacent word line, as shown in FIG. 4A, and through the cell as shown in FIG. 4B. Retrieval circuitry not shown senses any cell resistance value change to make the determination as to the direction of magnetization of the ferromagnetic material associated with the magnetically harder side of the nonmagnetic intermediate layer to thereby retrieve the data represented by this direction. As shown in FIG. 4C, the cell temperature does not rise significantly since in these circumstances only a quarter of the power is dissipated compared to the power dissipated in the first time period involved with the storing of data shown in FIG. 3A.

Figure 5A:
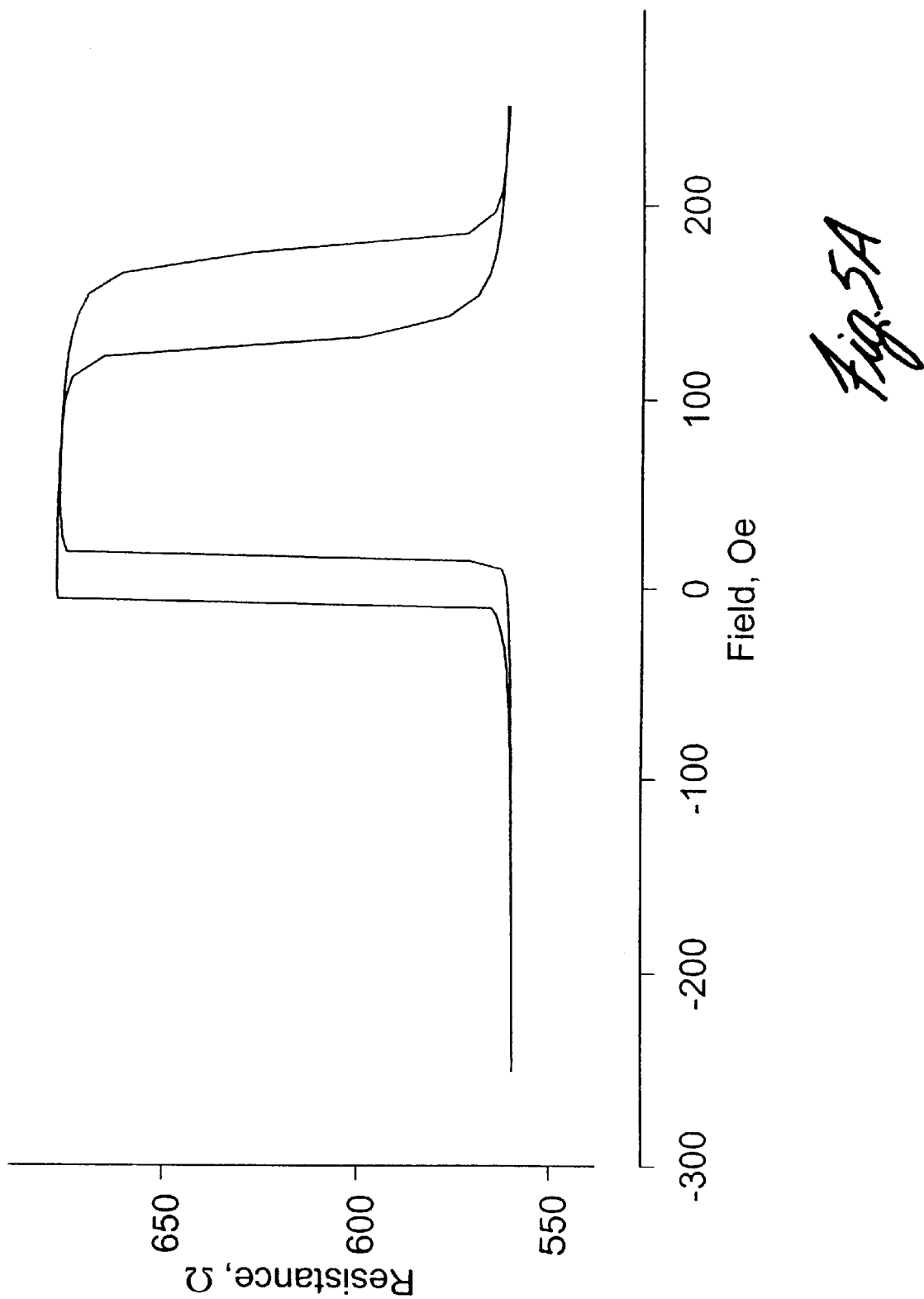

FIG. 5A shows the major resistance versus applied field characteristics for a "pinned" layer spin dependent tunneling memory cell having the maintained magnetization direction oriented in one direction along the length of that cell. A mirror image characteristic, i.e. essentially the same characteristic as shown in FIG. 5A rotated about the resistance axis, results for maintained magnetization direction oriented in the opposite direction along the length of that cell. During storage of data therein, however, these characteristics are transformed as the blocking temperature for the "pinning" layer is reached by either essentially collapsing if the blocking temperature exceeds the Curie temperature of the adjacent ferromagnetic layer or reverting to the major resistance versus applied field characteristics of just the ferromagnetic layers if it does not.

Figure 5B:
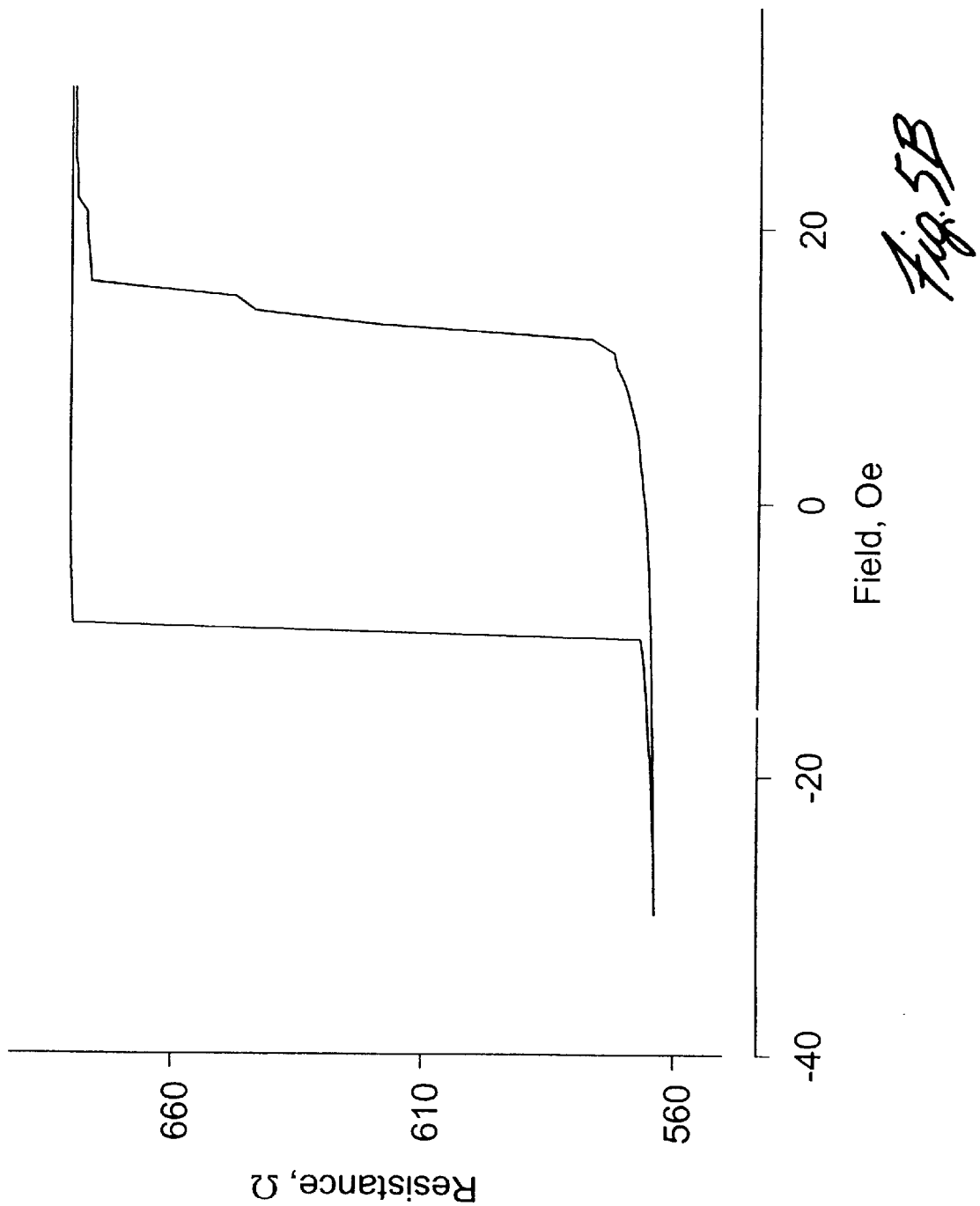

During retrieval of data from this memory cell, field magnitudes only relatively near zero are applied to these characteristics so that the operating point moves from one to the other of the two resistance lobes shown in FIG. 5A. This behavior effectively results in a minor loop characteristic for retrieval purposes as is shown in FIG. 5B.

Figure 6:
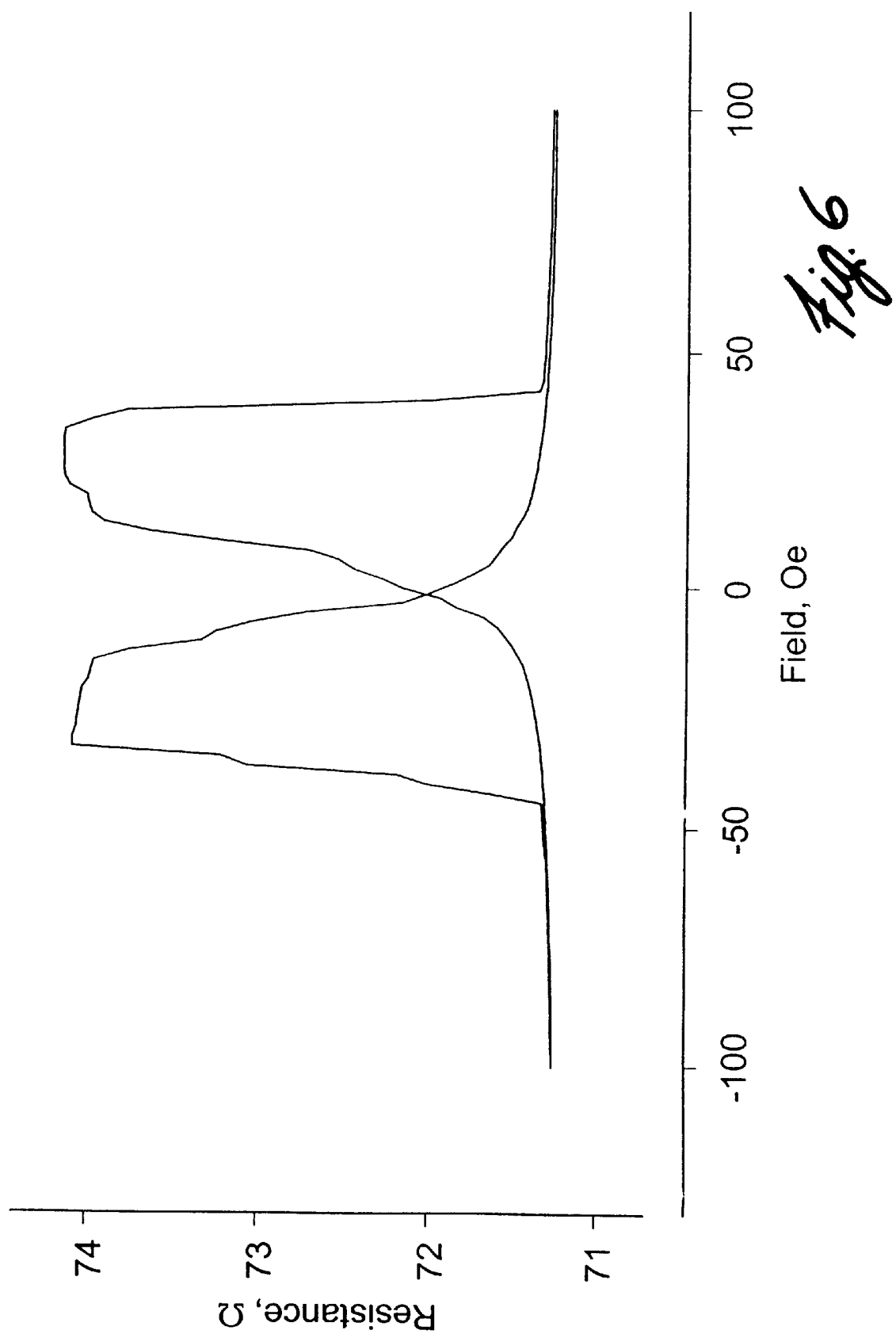
FIG. 6 represents a characteristic diagram for structures similar to the one shown in FIG. 1B.

Resistance versus applied field characteristics is shown in FIG. 6 for memory cells not using a "pinned" layer to maintain the direction of magnetization in the magnetically harder layer therein but instead using only the coercivity differences between the two ferromagnetic layers therein, here provided by only the thickness difference between those layers. One characteristic is shown for each direction of magnetization in the magnetically harder layer. These memory cells rely on the "giant magnetoresistive" effect in operation. Such characteristics essentially collapse when the Curie temperatures of these two layers are approached during data storage, but fields applied relatively near zero for data retrieval purposes, extending in magnitude out to reach the resistance lobes "plateaus", cause the cell resistance to essentially follow these characteristics.

Although the present invention has been described with reference to preferred embodiments, workers skilled in the art will recognize that changes may be made in form and detail without departing from the spirit and scope of the invention.

What is claimed is:

1. A ferromagnetic thin-film based digital memory, said memory comprising:

a plurality of bit structures, each supported on a substrate and separated from one another by spacer material therebetween, that are electrically interconnected with information retrieval circuitry, said bit structures each comprising a coupled moment material film in which magnetic moments of adjacent atoms, ions or molecules are coupled to one another to substantially maintain some alignment thereof below a critical temperature above which such alignment is not maintained, said bit structures each having a first interconnection structure providing electrical contact thereto positioned against at least one side thereof; and a plurality of word line structures each having a pair of word line end terminal regions adapted to conduct electrical current in at least one direction therethrough, each of said pairs of word line end terminal regions having an electrical conductor electrically connected therebetween which is located across said spacer material from a corresponding one of said bit structures and exhibiting sufficient electrical resistance there for a sufficient electrical current therethrough to cause substantial heating of a selected said corresponding bit structure to raise temperatures thereof to have said coupled moment material film therein at least approach said critical temperature thereof while being substantially above temperatures of at least an adjacent said bit structure because of sufficient extent of, and smallness of thermal conductivities of, said first interconnection structure positioned against said selected bit structure and of those portions of said substrate and said spacer material positioned thereabout.

2. The device of claim 1 wherein said selected bit structure is electrically interconnected so that an electrical current is also establishable therethrough during said heating thereof so as to cause its temperature to more closely approach or exceed said critical temperature of said magnetic material film therein.

3. The device of claim 1 wherein said coupled moment material film is a memory film of an anisotropic ferromagnetic material.

4. The device of claim 1 wherein said coupled moment material film is a magnetization direction maintaining film of an antiferromagnetic material, and said bit structures further comprise a memory film of an anisotropic ferromagnetic material positioned adjacent to said coupled moment material film.

5. The device of claim 1 wherein said coupled moment material film is a magnetization direction maintaining composite film including an antiferromagnetic material, and said bit structures further comprise a memory film of an anisotropic ferromagnetic material positioned adjacent to said coupled moment material film.

6. The device of claim 1 wherein said first interconnection structure extends to an adjacent one of said plurality of bit structures to make electrical contact thereto.

7. The device of claim 1 wherein said substrate comprises an electrical insulating layer over a monolithic integrated circuit, and further comprises a via interconnection structures each providing electrical contact to a corresponding one of said plurality of bit structures where positioned against at least one other side thereof through said insulating layer to a corresponding circuit portion in said monolithic integrated circuit.

8. The device of claim 3 wherein said plurality of bit structures each further comprises an electrically insulative intermediate layer having two major surfaces on opposite sides thereof with said memory film on each of said intermediate layer major surfaces of thicknesses differing from one another outwardly from those surfaces by at least 5% to thereby primarily provide switching thresholds below said critical temperature for magnetizations of said film adjacent each of said intermediate layer major surfaces that differ in value for a switching of these magnetizations from both being directed initially at least in part in substantially a common direction to being directed at least in part in substantially opposite directions versus a switching from being directed initially at least in part in substantially opposite directions to both being directed at least in part in substantially a common direction.

9. The device of claim 4 wherein said plurality of bit structures each further comprises an electrically insulative intermediate layer having two major surfaces on opposite sides thereof with said memory film on each of said intermediate layer major surfaces.

10. The device of claim 5 wherein said plurality of bit structures each further comprises an electrically insulative intermediate layer having two major surfaces on opposite sides thereof with said memory film on each of said intermediate layer major surfaces.

11. The device of claim 8 wherein a said bit structure has a length along a selected direction and a width substantially perpendicular thereto that is smaller in extent than said length and has a shaped end portion extending over a portion of said length in which said width gradually reduces to zero at an end thereof.

12. The device of claim 8 wherein said memory film at each of said major surfaces of said intermediate layer of at least one of said bit structures is arranged such that there are two separate films with one of said separate films on each of said major surfaces.

13. The device of claim 8 wherein said plurality of word line structures each has corresponding positional relationships with plural ones of said plurality of bit structures.

14. The device of claim 9 wherein a said bit structure has a length along a selected direction and a width substantially perpendicular thereto that is smaller in extent than said length and has a shaped end portion extending over a portion of said length in which said width gradually reduces to zero at an end thereof.

15. The device of claim 9 wherein said memory film at each of said major surfaces of said intermediate layer of at least one of said bit structures is arranged such that there are two separate films with one of said separate films on each of said major surfaces.

16. The device of claim 9 wherein said plurality of word line structures each has corresponding positional relationships with plural ones of said plurality of bit structures.

17. The device of claim 10 wherein a said bit structure has a length along a selected direction and a width substantially perpendicular thereto that is smaller in extent than said length and has a shaped end portion extending over a portion of said length in which said width gradually reduces to zero at an end thereof.

18. The device of claim 10 wherein said memory film at each of said major surfaces of said intermediate layer of at least one of said bit structures is arranged such that there are two separate films with one of said separate films on each of said major surfaces.

19. The device of claim 10 wherein said plurality of word line structures each has corresponding positional relationships with plural ones of said plurality of bit structures.

20. The device of claim 12 wherein said memory film at each of said major surfaces is a composite film having a thinner stratum of higher magnetic saturation induction adjacent the intermediate material and a thicker stratum of lower magnetic saturation induction.

21. The device of claim 15 wherein said memory film at each of said major surfaces is a composite film having a thinner stratum of higher magnetic saturation induction adjacent the intermediate material and a thicker stratum of lower magnetic saturation induction.

22. The device of claim 18 wherein said memory film at each of said major surfaces is a composite film having a thinner stratum of higher magnetic saturation induction adjacent the intermediate material and a thicker stratum of lower magnetic saturation induction.

23. A method for storing information in a plurality of bit structures electrically interconnected with information retrieval circuitry that are in a ferromagnetic thin-film based digital memory each comprising a coupled moment material film in which magnetic moments of adjacent atoms, ions or molecules are coupled to one another to substantially maintain some alignment thereof below a critical temperature above which such alignment is not maintained, there also being a plurality of word line structures each having a pair of word line end terminal regions adapted to conduct electrical current in at least one direction therethrough, each of said pairs of word line end terminal regions having an electrical conductor electrically connected therebetween located across from a corresponding one of said bit structures, said method comprising:
establishing coincidently electrical current in a selected direction through a said word line structure conductor across from a selected corresponding bit structure and electrical current in a selected direction through said selected bit structure sufficient to cause said coupled moment material film therein to heat sufficiently to at least approach said critical temperature thereof; and
reducing at least one of said electrical currents magnitudes sufficiently to allow said coupled moment material film to cool while generating a magnetic field about said coupled moment material film during such cooling.

24. The method of claim 23 wherein said electrical current through said selected bit structure is reduced to substantially zero magnitude during said cooling of said coupled moment material film.

25. The device of claim 2 wherein another said bit structure in said plurality thereof is electrically connected in series with said selected bit structure so that any said electrical current established through said selected bit structure during said heating thereof is also established through said other bit structure but is insufficient to heat that said other bit structure to substantially approach said critical temperature of said coupled moment material film therein, a said electrical current being establishable through said selected bit structure and a said electrical current being establishable through that said word line structure conductor across from said selected bit structure to cause together sufficient heating of said selected bit structure to allow that magnetization of a memory film of an anisotropic ferromagnetic material provided therein to be positioned in a selected direction by at least some portion of such electrical currents in less time than that maximum data storage time period allowed in that digital memory in which said selected bit structure is provided.

26. The device of claim 4 wherein said magnetization direction maintaining film is of an antiferromagnetic material having a blocking temperature as its critical temperature that is less than that Curie temperature characterizing said anisotropic ferromagnetic material of said adjacent memory film.

27. The device of claim 4 wherein said magnetization direction maintaining film is of an antiferromagnetic material having a blocking temperature as its critical temperature that is greater than that Curie temperature characterizing said anisotropic ferromagnetic material of said adjacent memory film.

28. The device of claim 5 wherein said magnetization direction maintaining composite film is of an antiferromagnetic material having a blocking temperature as its critical temperature that is less than that Curie temperature characterizing said anisotropic ferromagnetic material of said adjacent memory film.

29. The device of claim 5 wherein said magnetization direction maintaining composite film is of an antiferromagnetic material having a blocking temperature as its critical temperature that is greater than that Curie temperature characterizing said anisotropic ferromagnetic material of said adjacent memory film.

30. The device of claim 5 wherein said magnetization direction maintaining composite film including an antiferromagnetic material further includes two holding ferromagnetic layers separated by a ruthenium layer with said antiferromagnetic material having a blocking temperature as its critical temperature that is greater than that Curie temperature characterizing said anisotropic ferromagnetic material of said adjacent memory film.

31. The method of claim 23 wherein said electrical current through said word line structure conductor is reduced to substantially zero magnitude during said cooling of said coupled moment material film.

32. The device of claim 23 wherein another said bit structure in said plurality thereof is electrically connected in series with said selected bit structure so that any said electrical current established through said selected bit structure during said heating thereof is also established through said other bit structure but is insufficient to heat that said other bit structure to substantially approach said critical temperature thereof, said electrical current through said selected bit structure and said electrical current through that said word line structure conductor across from said selected bit structure causing together sufficient heating of said selected bit structure to allow that magnetization of a memory film of an anisotropic ferromagnetic material provided therein to be positioned in a selected direction by at least some portion of such electrical currents in less time than that maximum data storage time period allowed in that digital memory in which said selected bit structure is provided.

33. The device of claim 25 wherein said maximum data storage time period of said digital memory is less than 100 ns.

34. The device of claim 32 wherein said maximum data storage time period of said digital memory is less than 100 ns.

35. A ferromagnetic thin-film based digital memory, said memory comprising:

a plurality of bit structures, each supported on a substrate and separated from one another by spacer material therebetween, that are electrically interconnected with information retrieval circuitry, said bit structures each comprising a magnetic material film in which a characteristic magnetic property is substantially maintained below a critical temperature above which such magnetic property is not maintained, said bit structures each having a first interconnection structure providing electrical contact thereto positioned against at least one side thereof; and a plurailty of word line structures each having a pair of word line end terminal regions adapted to conduct electrical current in at least one direction therethrough, each of said pairs of word line end terminal regions having an electrical conductor electrically connected therebetween which is located across said spacer material from said magnetic material film in a corresponding one of said bit structures and exhibiting sufficient electrical resistance there for a sufficient electrical current therethrough to cause substantial heating of a selected said corresponding bit structure to raise temperatures thereof to have said magnetic material film therein at least approach said critical temperature thereof while being substantially above temperatures of at least an adjacent said bit structure because of sufficient extent of, and smallness of thermal conductivities of, said first interconnection structure positioned against said selected bit structure and of those portions of said substrate and said spacer material positioned thereabout.

36. The device of claim 35 wherein said selected bit structure is electrically interconnected so that an electrical current is also establishable therethrough during said heating thereof so as to cause its temperature to more closely approach or exceed said critical temperature of said magnetic material film therein.

37. The device of claim 35 wherein said magnetic material film is a memory of an anisotropic ferromagnetic material.

38. The device of claim 35 wherein said magnetic material film is a magnetization direction maintaining film of an antiferromagnetic material, and said bit structures further comprise a memory film of an anisotropic ferromagnetic material positioned adjacent to said magnetic material film.

39. The device of claim 35 wherein said magnetic material film is a magnetization direction maintaining composite film including an antiferromagnetic material, and said bit structures further comprise a memory film of an antisotropic ferromagnetic material positioned adjacent to said magnetic material film.

40. The device of claim 35 wherein said first interconnection sturcture extends to an adjacent one of said plurality of bit structures to make electrical contact thereto.

41. The device of claim 35 wherein said substrate comprises an electrical insulating layer over a monolithic integrated circuit, and further comprises a via interconnection structures each providing electrical contact to a corresponding one of said plurality of bit structures where positioned against at least one other side thereof through said insulating layer to a corresponding circuit portion in said monolithic intergrated circuit.

42. The device of claim 36 wherein another said bit structure in said plurality thereof is electrically connected in series with said selected bit structure so that any said electrical current established through said selected bit structure during said heating thereof is also established through said other bit structure but is insufficient to heat that said other bit strucutre to substantially approach said critical temperature thereof, a said electrical current being establishable through said selected bit structure and a said electrical current being establishable through that said word line structure conductor across from said selected bit structure to cause together sufficient heating of said selected bit structure to allow that magnetization of a memory film of an anisotropic ferromagnetic material provided therein to be positioned in a selected direction by at least some portion of such electrical currents in less time than that maximum data storage time period allowed in that digital memory in which said selected bit structure is provided.

43. The device of claim 37 wherein said plurality of bit structures each further comprises an electrically insulative intermediate layer having two major surfaces on opposite sides thereof with said memory film on each of said intermediate layer major surfaces of thickness differing from one another outwardly from those surfaces by at least 5% to thereby primarily provide switching thresholds below said critical temperature for magnetizations of said film adjacent each of said intermediate layer major surfaces that differ in value for a switching of these magnetizations from both being directed initially at least in part in substantially a common direction to being directed at least in part in substantially opposite directions versus a switching from being directed initially at least in part in substantially opposite directions to both being directed at least in part in substantially a common direction.

44. The device of claim 38 wherein said plurality of bit structures each further comprises an electrically insulative intermediate layer having two major surfaces on opposite sides thereof with said memory film on each of said intermediate layer major surfaces.

45. The device of claim 38 wherein said magnetization direction maintaining film is of an antiferromagnetic material having a blocking temperature as its critical temperature that is less than that Curie temperature characterizing said anisotropic ferromagnetic material of said adjacent memory film.

46. The device of claim 38 wherein said magnetization direction maintaining film is of an antiferromagnetic material having a blocking temperature as its critical temperature that is greater than that Curie temperature characterizing said anisotropic ferromagnetic material of said adjacent memory film.

47. The device of claim 39 wherein said plurality of bit structures each further comprises an electrically insulative intermediate layer having two major surfaces in opposite sides thereof with said memory film on each of said intermediate layer major surfaces.

48. The device of claim 39 wherein said magnetization direction maintaining composite film is of an antiferromagnetic material having a blocking temperature as its critical temperature that is less than that Curie temperature characterizing said anisotropic ferromagnetic material of said adjacent memory film.

49. The device of claim 39 wherein said magnetization direction maintaining composite film is of an antiferromagnetic material having a blocking temperature as its critical temperature that is greater than that Curie temperature characterizing said anisotropic ferromagnetic material of said adjacent memory film.

50. The device of claim 39 wherein said magnetization direction maintaining composite film including an antiferromagnetic material further includes two holding ferromagnetic layers separated by a ruthenium layer with said antiferromagnetic material having a blocking temperature as its critical temperature that is greater than that Curie temperature characterizing said anisotropic ferromagnetic material of said adjacent memory film.

51. The device of claim 42 wherein said maximum data storage time period of said digital memory is less than 100 ns.

52. A method for storing information in a plurality of bit structures electrically interconnected with information retrieval circuitry that are in a ferromagnetic thin-film based digital memory each comprising a magnetic material film in which a characteristic magnetic property is substantially maintained below a critical temperature above which such magnetic property is not maintained, there also being a plurality of word line structures each having a pair of word line end terminal regions adapted to conduct electrical current in at least one direction therethrough, each of said pairs of word line end terminal regions having an electrical conductor electrically connected therebetween located across from a corresponding one of said bit structures, said method comprising:

establishing coincidently electrical current in a selected direction through a said word line structure conductor across from a selected corresponding bit structure and electrical current in a selected direction through said selected bit structure sufficient to cause said magnetic material film therein to heat sufficiently to at least approach said critical temperature thereof; and reducing magnitude of at least one of said electrical currents sufficiently to allow said magnetic material film to cool while generating a magnetic field based on at least one of said electrical currents about said magnetic material film during such cooling.

53. The method of claim 52 wherein said electrical current through said selected bit structure is reduced to substantially zero magnitude during said cooling of said magnetic material film.

54. The method of claim 52 wherein said electrical current through said word line structure conductor is reduced to substantially zero magnitude during said cooling of said magnetic material film.

55. The method of claim 52 wherein another said bit structure in said plurality thereof is electrically connected in series with said selected bit structure so that any said electrical current established through said selected bit structure during said heating thereof is also established through said other bit structure but is insufficient to heat that said other bit structure to substantially approach said critical temperature of said magnetic material film therein, said electrical current through said selected bit structure and said electrical current through that said word line structure conductor across from said selected bit structure causing together sufficient heating of said selected bit structure to allow that magnetization of a memory film of an anisotropic ferromagnetic material provided therein to be positioned in a selected direction by at least some portion of such electrical currents in less time than that maximum data storage time period allowed in that digital memory in which said selected bit structure is provided.

56. The device of claim 55 wherein said maximum data storage time period of said digital memory is less than 100 ns.

57. A method for storing information in a plurality of bit structures electrically interconnected with information retrieval circuitry that are in a ferromagnetic thin-film based digital memory each comprising a coupled moment material film in which magnetic moments of adjacent atoms, ions or molecules are coupled to one another to substantially maintain some alignment thereof below a critical temperature above which such magnetic property is not maintained, there also being a plurality of word line structures each having a pair of word line end terminal regions adapted to conduct electrical current in at least one direction therethrough, each of said pairs of word line end terminal regions having an electrical conductor electrically connected therebetween located across from a corresponding one of said bit structures, there being another said bit structure in said plurality thereof electrically connected in series with said selected bit structure, said method comprising:

establishing an electrical current in a selected direction through a said word line structure conductor across from a selected corresponding bit structure; and establishing an electrical current in a selected direction through said selected bit structure that is insufficient to heat that said other bit structure to substantially approach said critical temperature of said coupled moment material film therein, said electrical crrent through said selected bit structure and said electrical current through that said word line structure conductor across from said selected bit structure causing together sufficient heating of said selected bit structure to allow that magnetization of a memory film of an anisotropic ferromagnetic material provided therein to be positioned in a selected direction by at least some portion of such electrical currents in less time than that maximum data storage time period allowed in that digital memory in which said selected bit structure is provided.

58. The method of claim 57 wherein at least one of said electrical currents has its magnitude reduced sufficiently to allow said coupled moment material film to cool while at least one of said electrical currents generates a magnetic field about said coupled moment material film during such cooling.

59. The device of claim 57 wherein said maximum data storage time period of said digital memory is less than 100 ns.

60. A method for storing information in a plurality of bit structures electrically interconnected with information retrieval circuitry that are in a ferromagnetic thin-film based digital memory each comprising a magnetic material film in which a charasterisitic magnetic property is substantially maintained below a critical temperature above which such magnetic property is not maintained, there also being a plurality of word line structures each having a pair of word line end terminal regions adapted to conduct electrical current in at least one direction therethrough, each of said pairs of word line end terminal regions having an electrical conductor electrically connected therebetween located across from a corresponding one of said bit structures, there being another said bit structure in said plurality thereof electrically connected in series with said selected bit structure, said method comprising:
- establishing an electrical current in a selected direction through a said word line structure conductor across from a selected corresponding bit structure; and
- establishing an electrical current in a selected direction through said selected bit structure that is insufficient to heat that said other bit structure to substantially approach said critical temperature of said magnetic material film therein, said electrical current through said selected bit structure and said electrical current through that said word line structure conductor across from said selected bit structure causing together sufficient heating of said selected bit structure to allow that magnetization of a memory film of an anisotropic ferromagnetic material provided therein to be positioned in a selected direction by at least some portion of such electrical currents in less time than that maximum data storage time period allowed in that digital memory in which said selected bit structure is provided.

61. The method of claim 60 wherein at least one of said electrical currents has its magnitude reduced sufficiently to allow said magnetic material film to cool while at least one of said electrical currents generates a magnetic field about said magnetic material film during such cooling.

62. The device of claim 60 wherein said maximum data storage time period of said digital memory is less than 100 ns.

63. A ferromagnetic thin-film based digital memory, said memory comprising:
- a plurality of bit structures, each supported on a substrate and separated from one another by spacer material therebetween, that are electrically interconnected with information retrieval circuitry, said bit structures each comprising a first magnetic material film in which a characteristic magnetic property is substantially maintained below a first critical temperature above which such magnetic property is not maintained and a second magnetic material film in which a characteristic magnetic property is substantially maintained below a second critical temperature above which such magnetic property is not maintained, and with said second magnetic material film being separated from said first magnetic material film by at least one layer of a nonmagnetic material, said bit structures each having a first interconnection structure providing electrical contact thereto positioned against at least one side thereof; and
- a plurality of word line structures each having a pair of word line end terminal regions adapted to conduct electrical current in at least one direction therethrough, each of said pairs of word line end terminal regions having an electrical conductor electrically connected therebetween which is located across said spacer material from said first and second magnetic material films in a corresponding one of said bit structures and exhibiting sufficient electrical resistance there for a sufficient electrical current therethrough to cause substantial heating of a selected said corresponding bit structure to raise temperatures thereof to have said first and second magnetic material films therein at least approach that one of said first and second critical temperatures of greater value while being substantially above temperatures of at least an adjacent said bit structure because of sufficient extent of, and smallness of thermal conductivities of, said first interconnection structure positioned against said selected bit structure and of those portions of said substrate and said spacer material positioned thereabout.

64. The device of claim 63 wherein said selected bit structure is electrically interconnected so that an electrical current is also establishable therethrough during said heating thereof so as to cause its temperature to more closely approach or exceed said critical temperature of said magnetic material film therein.

65. The device of claim 63 wherein said first interconnection structure extends to an adjacent one of said plurality of bit structures to make electrical contact thereto.

66. The device of claim 63 wherein said substrate comprises an electrical insulating layer over a monolithic integrated circuit, and further comprises a via interconnection structures each providing electrical contact to a corresponding one of said plurality of bit structures where positioned against at least one other side thereof through said insulating layer to a corresponding circuit portion in said monolithic integrated circuit.

67. The device of claim 63 wherein said first magnetic material film is a magnetization direction maintaining film of an antiferromagnetic material, and said bit structures further comprise a first memory film of an anisotropic ferromagnetic material positioned adjacent to said first magnetic material film.

68. The device of claim 63 wherein said first magnetic material film is a magnetization direction maintaining composite film including an antiferromagnetic material, and said bit structures further comprise a first memory film of an anisotropic ferromagnetic material positioned adjacent to said first magnetic material film.

69. The device of claim 67 wherein said magnetization direction maintaining film is of an antiferromagnetic material having a blocking temperature as its criticl temperature that is less than that Curie temperature characterizing said anisotropic ferromagnetic material of said first memory film.

70. The device of claim 67 wherein said magnetization directon maintaining film is of an antiferromagnetic material having a blocking temperature as its critical temperature that is greater than that Curie temperature characterizing said anisotropic ferromagnetic material of said first memory film.

71. The decive of claim 67 wherein said second magnetic material film comprises a second memory film of an anisotropic ferromagnetic material.

72. The device of claim 68 wherein said magnetization direction maintaining composite film is of an antiferromagnetic material having a blocking temperature as its critical temperature that is less than that Curie temperature characterizing said anisotropic ferromagnetic material of said first memory film.

73. The device of claim 68 wherein said magnetization direction maintaining composite film is of an antiferromagnetic material having a blocking temperature as its critical temperature that is greater than that Curie temperature characterizing said anisotropic ferromagnetic material of said first memory film.

74. The device of claim 68 wherein said magnetization direction maintaining composite film including an antiferromagnetic material further includes two holding ferromagnetic layers separated by a ruthenium layer with said antiferromagnetic material having a blocking temperature as its critical temperature that is greater than that Curie temperature characterizing said anisotropic ferromagnetic material of said first memory film.

75. The device of claim 68 wherein said second magnetic material film comprises a second memory film of an anisotropic ferromagnetic material.

76. The device of claim 71 wherein said layer of a nonmagnetic material comprises an electrically insulative material.

77. The device of claim 71 wherein said layer of a nonmagnetic material comprises an electrically conductive material.

78. The device of claim 75 wherein said layer of a nonmagnetic material comprises an electrically insulative material.

79. The device of claim 75 wherein said layer of a nonmagnetic material comprises an electrically conductive material.

* * * * *